United States Patent
Kondo et al.

(10) Patent No.: US 6,194,656 B1
(45) Date of Patent: *Feb. 27, 2001

(54) MOUNTING STRUCTURE FOR A RELAY ARRANGED ON A PRINTED CIRCUIT BOARD

(75) Inventors: Youichi Kondo; Masataka Suzuki; Yasuyuki Watanabe, all of Shizuoka-ken (JP)

(73) Assignee: Yazaki Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/953,377

(22) Filed: Oct. 17, 1997

(30) Foreign Application Priority Data

Oct. 17, 1996 (JP) .................................................. 8-275003
Feb. 28, 1997 (JP) .................................................. 9-046278

(51) Int. Cl.⁷ ........................................................ H02G 3/08
(52) U.S. Cl. ........................ 174/52.1; 174/260; 174/251; 361/775; 361/773
(58) Field of Search ................................. 174/251, 261, 174/52.1, 260, 52.3; 361/781, 704, 688, 720, 722, 780, 782, 775, 774, 773; 257/696, 697, 693

(56) References Cited

U.S. PATENT DOCUMENTS 3,151,278 * 9/1964 Elarde .................................. 361/745
3,174,085 * 3/1965 Schroeder, Jr. et al. ............. 361/520
3,234,320 * 2/1966 Wong .................................. 174/52.3
3,386,009 * 5/1968 Grabbe ................................. 361/774
3,423,638 * 1/1969 Dix et al. ............................. 361/728
3,588,618 * 6/1971 Ohe ..................................... 361/809
3,771,101 * 11/1973 Elkins .................................... 439/83
4,688,149 * 8/1987 Inoue et al. .......................... 361/399
5,065,283 * 11/1991 Adachi et al. ....................... 361/407
5,122,621 * 6/1992 Rohde et al. ....................... 174/52.4
5,686,698 * 11/1997 Mahadevan et al. ............... 174/52.4
5,729,051 * 3/1998 Nakamura ........................... 257/668
5,821,483 * 10/1998 Yamaguchi et al. ................. 200/5 R

FOREIGN PATENT DOCUMENTS 6-45371      6/1994  (JP) .
6-232571  *  8/1994  (JP) .
7-13277      3/1995  (JP) .
7-122867  *  5/1995  (JP) .

* cited by examiner

Primary Examiner—Jeffrey Gaffin
Assistant Examiner—Kamand Cuneo
(74) Attorney, Agent, or Firm—Oblon, Spivak, McClelland, Maier & Neustadt, P.C.

(57) ABSTRACT

In a mounting structure for a relay arranged on a printed circuit board, a resin block having at least one insert-molded bus bar is fixed on the printed circuit board. One end of the bus bar held by the resin block is joined together with a terminal of the relay by welding, while the other end of the bus bar is soldered to a printed wiring pattern formed on the printed circuit board. Therefore, a heat (temperature) of the terminal of the relay can be absorbed through the bus bar and the resin block.

10 Claims, 3 Drawing Sheets

MOUNTING STRUCTURE FOR A RELAY ARRANGED ON A PRINTED CIRCUIT BOARD

BACKGROUND OF THE INVENTION

1. Field of the Invention

The present invention relates to a mounting structure for a relay which is mounted under a high temperature environment such as an engine room of an automobile.

2. Description of the Related Art

In general, when mounting a relay on a printed circuit board in an electric connection (junction) box of an automobile, a terminal of the relay is soldered thereon in an automatic process of a flow system.

In the related art, the printed circuit board of the electric connection box is fixed onto a case body by means of a screw. A relay is mounted on the printed circuit board, and then, the terminal of the relay is soldered to a printed wiring pattern on the printed circuit board. Moreover, in order to make an electrical connection with the outside, a connector terminal constituting a connector is soldered onto the printed circuit board.

In the case where the aforesaid electric connection box is mounted under a high temperature environment such as an engine room of an automobile, there is a possibility that among relay terminals, in particular, a temperature of a movable (COM) terminal exceeds a welding guaranteed level (guaranteed temperature) of a soldering joined part because the terminal is very exothermic.

In order to avoid the aforesaid disadvantage, it is considered that soldering is carried out so as to increase an amount of solder by manually or a solder having a high fusing point is used. However, this causes a problem of increasing cost.

SUMMARY OF THE INVENTION

The present invention has been achieved with such points in mind.

It therefore is an object of the present invention to provide a mounting structure for a relay, which can lower a temperature of a relay terminal so that a temperature of a solder welding part for making a connection between a printed circuit board and the relay is made less than a guaranteed level.

It is another object of the present invention to provide a mounting structure for a relay which can prevent the reliability of a solder junction from being lowered by a rise of the temperature of relay terminal.

To achieve the object, according to a first aspect of the present invention, there is provided a mounting structure for a relay arranged on a printed circuit board, comprising: a resin block having a relay mounting opening to be inserted with the relay; and a bus bar insert-molded in the resin block having a first end to be connected with a terminal of the relay by welding and a second end to be soldered to a printed wiring pattern formed on the printed circuit board.

With the aforesaid mounting structure, since a heat of the terminal of the relay which becomes high in temperature is absorbed through the bus bar and the resin block, a temperature of the soldering part of the printed circuit board and the bus bar does not rise so much.

In particular, since the terminal of the relay is connected to the printed circuit board via the bus bar inserted into the resin block without directly soldering the terminal to the printed circuit board, the heat of the relay terminal which becomes high in temperature can be absorbed through the bus bar and the resin block. Thus, even if the bus bar is soldered to the printed circuit board in the automatic process of the flow system, the temperature of the soldering part can be suppressed less than the guaranteed level, and also, reliability of the soldering part can be secured. Therefore, there is no need of carrying out manual soldering and using a solder having a high fusing point, so that an increase of cost can be suppressed.

According to a second aspect of the present invention, as it depends from the first aspect, the mounting structure for a relay further comprises a second bus bar insert-molded in the resin block having a first end to be connected with a terminal of the relay by welding and a second end connecting to a connector to be connected to the mounting structure.

With the aforesaid mounting structure, in particular, since the movable terminal of the relay which is very exothermic is directly connected to the outside connector without soldering it to the printed circuit board, there is no need of taking a rise of temperature of the terminal into consideration.

According to a third aspect of the present invention, as it depends from the first aspect or the second aspect, the first end of the bus bar is formed with a bent portion being overlapped with the terminal of the relay; and the bent portion of the bus bar is connected with the terminal of the relay by welding in a state that the bent portion and the terminal of the relay are overlapped each other.

With the aforesaid mounting structure, the reliability of the welding part of the terminal of the relay and the bus bar can be enhanced.

According to a fourth aspect of the present invention, as it depends from any one of the first aspect to the third aspect, the resin block has a rectangular parallelepiped shape; a plurality of the relay mounting openings are formed in line on the middle in a width direction of the resin block to be inserted with a plurality of the relays; a plurality of the bus bars extend from each of the relay mounting openings to both sides in the width direction of the resin block; a plurality of the first ends of the bus bar are connected to the terminals of the relays by welding; and a plurality of the second ends of the bus bars are projected into the outside from the both sides in the width direction of the resin block.

With the aforesaid mounting structure, many relays are orderly arranged. Also, since the bus bar extends to both sides in the width direction of the resin block, a heat is hard to remain in the resin block, and the heat is easy to be further absorbed through the bus bar.

According to a fifth aspect of the present invention, as it depends from any one of the first aspect to the fourth aspect, the resin block has a rectangular parallelepiped shape and has a fixing surface to be fixed onto the printed circuit board; the first end of the bus bar is projected from the side opposite to the fixing surface to be fixed onto the printed circuit board to be connected to the terminal of the relay; and the second end of the bus bar is projected from the fixing surface to be fixed onto the printed circuit board to be soldered to the printed wiring pattern formed on the printed circuit board.

With the aforesaid mounting structure, since a heat of the terminal of the relay which becomes high temperature is absorbed through the bus bar and the resin block, a temperature of the soldering part of the printed circuit board and the bus bar does not rise so much. In this case, in the present invention, since the terminal of the relay and the other end of the bus bar are joined together on the side opposite to the fixing surface of the resin block, the bus bar which is insert-molded in the resin block is projected into the fixing surface side can be made long. Thus, the heat of the terminal of the relay is easy to be further absorbed.

According to a sixth aspect of the present invention, as it depends from the fifth aspect, the relay is mounted into the resin block from the fixing surface side, and the relay and the resin block are received in a case body together with the printed circuit board.

With the aforesaid mounting structure, since the relay is mounted into the resin block, the terminal of the relay and the first end of the bus bar are preferably connected to, and a further secure connection can be provided. Therefore, the relay does not tremble by an inertia force of oneself due to vibration and impact, so that a strong structure can be provided.

BRIEF DESCRIPTION OF THE ACCOMPANING DRAWINGS

The above and further objects and novel features of the present invention will more fully appear from the following detailed description when the same is read in conjunction with the accompanying drawings, in which:

FIGS. 1A and 1B each show a electric connection box to which mounting structure according to a first embodiment of the present invention is applied, FIG. 1A being a side cross-sectional view of the electric connection box, and FIG. 1B being a plan view showing a state in which a cover case of the electric connection box is removed;

DETAILED DESCRIPTION OF THE PREFERRED EMBODIMENS

Figure 1A:
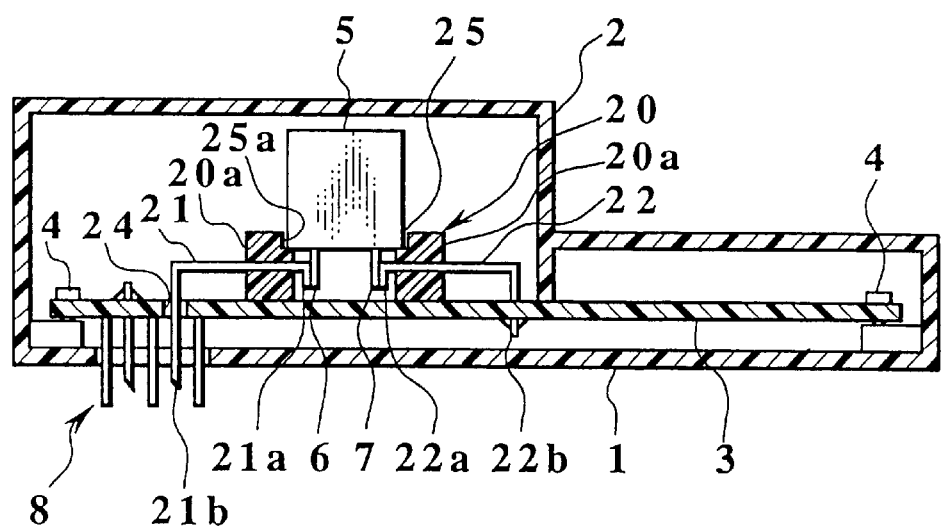

There will be detailed below the preferred embodiments of the present invention with reference to the accompanying drawings. Like members are designated by like reference characters.

Figure 1B:
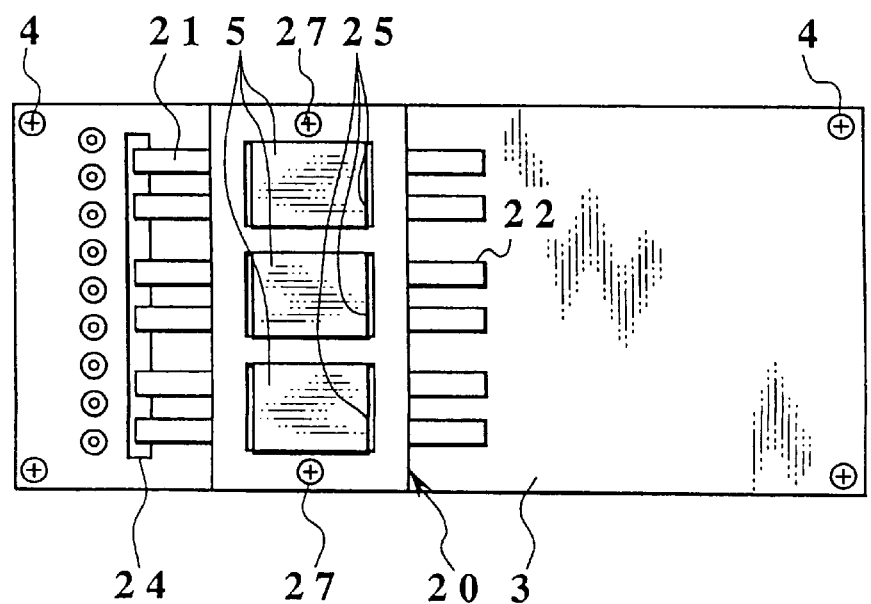
Figure 2A:
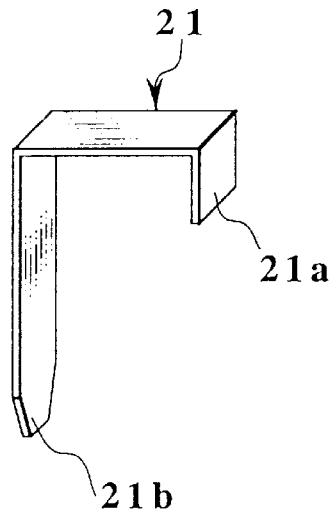
FIGS. 2A and 2B are individually perspective views showing taken-out bus bars of FIGS. 1A and 1B, FIG. 2A being a view showing a first bus bar, and FIG. 2B being a view showing a second bus bar.
Figure 2B:
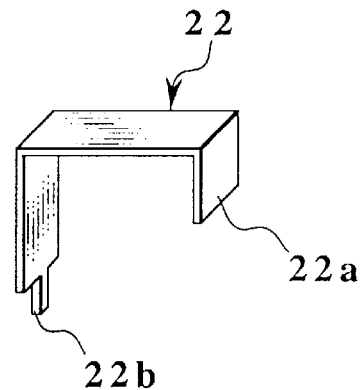

FIGS. 1A and 1B show an electric connection box to which a mounting structure according to a first embodiment of the present invention is applied, FIG. 1A being a side cross-sectional view of the electric connection box, and FIG. 1B being a plan view showing a state in which a cover case of the electric connection box is removed. Also, FIGS. 2A and 2B are perspective views showing two bus bars which are taken out.

In these figures, a reference numeral 1 denotes a case body, 2 denotes a cover case, 3 denotes a printed circuit board, and the printed circuit board 3 is fixed on the case body 1 by means of a screw 4. A relay 5 is mounted on the printed circuit board 3 via a resin block 20. The resin block 20 is formed by subjecting two kinds of a first bus bar 22 and a second bus bar 21 to insert molding, and is fixed on the printed circuit board 3 by means of a screw 27.

The resin block 20 has a rectangular parallelepiped shape, and is formed with relay mounting openings 25 which are arranged in line on the middle of the width direction of the resin block 20. The relay 5 is placed on stepped portions 25a formed in these relay mounting openings 25, that is, the resin block 20. Moreover, the first and second bus bars 21 and 22 are respectively inserted through the resin block 20 so as to extend from the inside of relay mounting opening 25 toward both sides of the resin block in the width direction thereof. One end of the bus bar 21 and one end of the bus bar 22 are joined together with terminals 6 and 7 of the relay 5 by welding in the relay mounting opening 25, respectively.

In this case, one end of the bus bar 21 and one end of the bus bar 22 are formed with bent portions 21a and 22a as first ends which overlap with terminals 6 and 7, respectively. These bent portions 21a and 22a and relay terminals 6 and 7 are joined together by welding in a state that the former and latter overlap each other. This serves to improve reliability in welding of relay terminals 6 and 7 (i.e., pin-terminals) and bus bars 21 and 22.

Also, the other ends 21b and 22b as second ends of bus bars 21 and 22 are projected from side face 20a of the resin block 20 to the outside in the width direction thereof. The first bus bar 21 is joined together with the movable terminal 6 of the relay 5. The other end (distal end) 21b of the bus bar 21 is formed as a male terminal which should be connected to a movable terminal of a connector, as shown in FIG. 2A. As shown in FIG. 1 and FIG. 2, the terminal portion is extended below the printed circuit board 3 via a through hole 24 formed in the printed circuit board 3 so as to constitute a connector 8. Also, the other end 22b of the second bus bar 22 is formed as a portion for soldering, as shown in FIG. 2B, and is soldered to the printed wiring pattern (not shown) on the printed circuit board 3 as shown in FIG. 1.

In the aforesaid mounting structure, a heat of the terminal 7 of the relay 5 which becomes high in temperature is absorbed through the bus bar 22 and the resin block 20, so that a temperature of the solder welding part between the printed circuit board 3 and the other end 22b of the bus bar 22 does not rise so much. Therefore, even if soldering is carried out with respect to the part in an automatic process of a flow system, the rise of temperature of the solder welding part is suppressed less than a guaranteed level, so that a reliability of the solder welding part can be secured. In particular, the movable terminal 6 which is very exothermic is directly connected to the outside connector without soldering it to the printed circuit board 3, so that there is no need of taking the rise of temperature of the terminal 6 into consideration. As a result, it is possible to prevent reliability from being lowered by the influence of the rise of temperature of the terminal of the relay.

Moreover, relay mounting openings 25 are formed in a state of being arranged in line on the middle of the resin block 20 in the width direction thereof, and first and second bus bars 21 and 22 are projected from both sides of the resin block 20 in the width direction thereof so as to correspond to these relay mounting openings. Therefore, even the case where many relays 5 are mounted, these relays 5 can be orderly arranged. In addition, the heat from relay 5 does not remain in the resin block 20, and the heat can be further absorbed through the bus bars 21 and 22.

Figure 3:
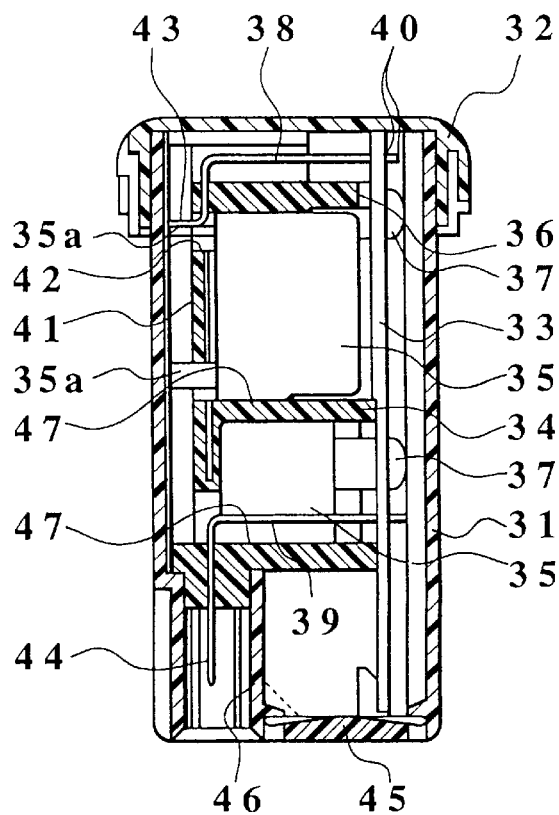
FIG. 3 is a cross-sectional view showing an electric connection box to which a mounting structure according to a second embodiment of the present invention is applied.
Figure 4:
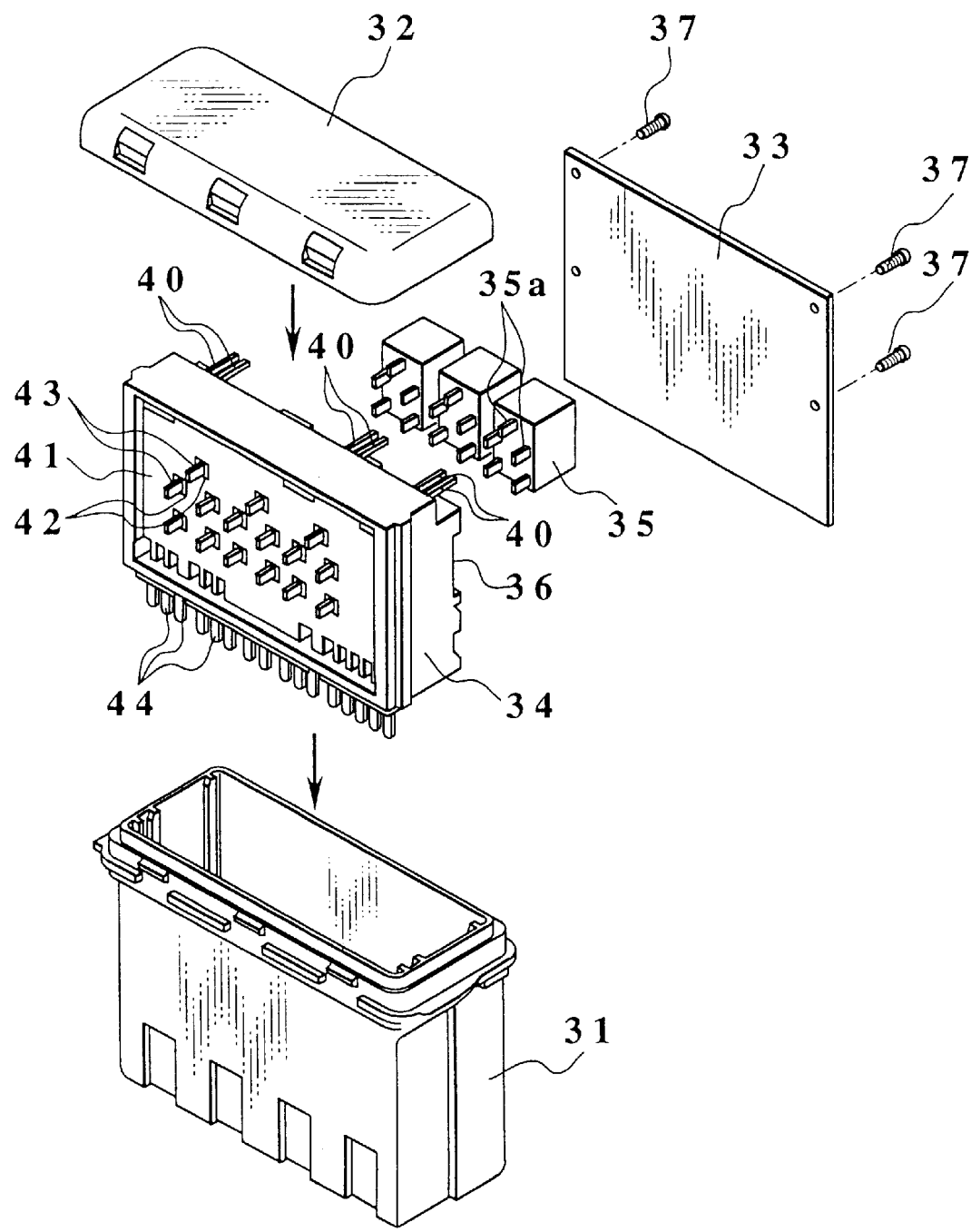
FIG. 4 is an exploded perspective view showing an electric connection box to which the mounting structure according to the second embodiment of the present invention is applied.

FIG. 3 and FIG. 4 show an electric connection box to which a mounting structure according to a second embodiment of the present invention is applied, FIG. 3 being a cross-sectional view of the electric connection box, and FIG. 4 being an exploded perspective view thereof.

In FIG. 3 and FIG. 4, the electric connection box comprises a case body 31 having an upper opening, a cover case 32 which is capable of closing the upper opening of the case body 31, a printed circuit board 33 on which a printed wiring pattern or interconnecting pattern (not shown) is formed, a resin block 34 which is fixed onto the printed circuit board 33, and a relay 35 which is connected to the printed wiring pattern formed on the printed circuit board 33.

The resin block 34 has a rectangular parallelepiped shape, and has a fixing surface 36 which is fixed to the printed circuit board 33 at its one side. The fixing surface 36 side is fixed onto the printed circuit board 33 by means of a screw 37 so as to face the printed circuit board 33.

A plurality of first and second bus bars 38 and 39 are arranged and built in the resin block 34 by insert molding. One ends of respective bus bars 38 and 39 are projected from the fixing surface 36 side so that a terminal 40 for making a connection with the printed circuit board 33 is formed. The other ends of bus bars 38 and 39 are each projected from a rectangular-like hole 42 formed in a surface 41 opposite to the fixing surface 36 to the outside so as to be formed as a relay terminal welding part (overlapped portion) 43 which is joined together with a terminal 35a of the relay 35.

Also, one end of the bus bar 39 is projected from the fixing surface 36 side so as to be formed as a terminal 40 for making a connection with the printed circuit board 33, the other end of bus bar 39 is formed as a male terminal part 44 which should be connected to a connected, as shown in FIG. 4. The male terminal part 44 is projected into a hood portion 46 formed in a bottom wall 45 of the case body 31, as shown in FIG. 3.

Further, the resin block 34 is formed with a plurality of relay mounting openings 47 which is opened in the fixing surface 36 side. A plurality of relays 35 are respectively inserted into these relay mounting openings 47 from the fixing surface 36 side. And then, the relay terminal 35a of relay 35 which is inserted into the relay mounting opening 47 is projected from the aforesaid hole 42 toward the outside so as to be joined together with the relay terminal welding part 43 of the bus bar 39.

Next, the following is an explanation about a procedures for assembling the aforesaid electric connection box.

The relay 35 is inserted into each of the relay mounting openings 47 of the resin block 34 in which bus bars 38 and 39 are arranged and built by insert molding, and the terminal 35a of the relay 35 is projected to the outside through the hole 42 so as to be joined together with the relay terminal welding part 43 of the bus bar 38 by welding in a state of being overlapped therewith. And then, the plurality of relays 35 are each inserted into the relay mounting openings 47, and the terminal 35a of the relay 35 is joined together with the relay terminal welding part 43 of the bus bar 38. Thereafter, the fixing surface 36 side of the resin block 34 faces the printed circuit board 33 so as to be overlapped with each other, and is fixed one another by means of a screw 37. At this time, the terminal 40 for making a connection with the printed circuit board 33 is projected into the back side of the printed circuit board 33. And then, the terminal 40 projected into the back side of the printed circuit board 33 is soldered to the printed wiring pattern formed on the printed circuit board 33.

Subsequently, the resin block 34, which is in a state of being fixed onto the printed circuit board 33, is inserted into the case body 31 via the upper opening. At this time, the male terminal part 44 of the bus bar 39 projects into the hood 46. And then, the upper opening of the case body 31 is closed with the case cover 32, and thus, the electric connection box is assembled so that the relay 35 is mounted therein.

In this mounting structure, since the heat of the terminal 35a of the relay 35 which becomes high temperature is absorbed through the bus bar 38 and the resin block 34, a temperature of the soldering part of the printed circuit board 33 and the terminal 40 of the bus bar 38 for making a connection with the printed circuit board does not rise so much. Moreover, in this embodiment, since the joined part of the terminal 35a of the relay 35 and the relay terminal welding part 43 of the bus bar 38 is provided in the side opposite to the fixing surface 36, the bus bar 38 built in the resin block 34 is made long. As a result, the heat of the terminal 35a of the relay 35 is easy to be further absorbed.

Therefore, even if soldering is carried out with respect to the printed circuit board 33 and the terminal 40 of the bus bar 38 for making a connection with the printed circuit board in the automatic process of the flow system, the temperature of the soldering part can be suppressed less than the guaranteed level, and also, reliability of the soldering part can be secured.

In particular, since the movable terminal 35a which is very exothermic is directly connected to the outside connector without direct soldering it to the printed circuit board 33, there is no need of taking a rise of the temperature of the relay terminal 35a into consideration. As a results, this serves to prevent the reliability from being lowered due to the influence of the rise of temperature of the terminal 35a of the relay 35.

Further, in the mounting structure of the present embodiment, the terminal 35a of the relay 35 is joined together with the relay terminal welding part 43 of the bus bar 38 by welding, so that a rise of temperature by contact resistance can be restricted to the minimum. As a result, the influence on the soldering part can be sufficiently suppressed.

Furthermore, in the mounting structure of the present embodiment, the terminal of the relay and the other end of the bus bar are joined together on the side opposite to the fixing surface of the resin block, so that the bus bar which is insert-molded is projected into the fixing surface side can be made long. Thus, the heat of the terminal of the relay is easy to be further absorbed.

In addition, in the mounting structure of the present embodiment, since the relay is mounted into the resin block, the terminal of the relay and the other end of the bus bar are preferably joined together, and a further secure connection can be provided. Therefore, the relay is not shaky by an inertia force of oneself due to vibration and impact, so that a strong structure can be provided.

While preferred embodiments of the present invention have been described using specific terms, such description is for illustrative purposes, and it is to be understood that changes and variations may be made without departing from the spirit or scope of the following claims.

What is claimed is:

1. A mounting structure having a relay arranged on a printed circuit board, comprising:

a resin block having at least one relay mounting opening; and at least one bus bar insert-molded in the resin block and having a first end with a straight portion and a bent portion, the bent portion connected with a terminal of the relay by a welding, and a second end soldered to a printed wiring pattern formed on the printed circuit board, the second end being colinear with the straight portion of the first end and projecting outwardly in the width direction of the resin block, wherein the bent portion is within the at least one relay opening and overlaps with the terminal of the relay, and wherein the resin block has a rectangular parallelepiped shape and has a fixing surface fixed onto the printed circuit board.

2. The mounting structure having a relay according to claim 1, further comprising:

a second bus bar insert-molded in the resin block and having a first end connected with a terminal of the relay by welding and a second end connecting to a connector connected to the mounting structure.

3. The mounting structure having a relay according to claim 1, wherein the at least one relay mounting opening includes a plurality of relay mounting openings formed in line on a middle in the width direction of the resin block and are inserted with a plurality of relays; and the at least one bus bar includes a plurality of bus bars extending from each of the relay mounting openings in a width direction of the resin block;

first ends of the plurality of bus bars are connected to terminals of the relays by welding; and second ends of the plurality of bus bars project outwardly in the width direction of the resin block.

4. The mounting structure having a relay according to claim 1, wherein the first end of the bus bar is projected away from a surface of the resin block perpendicular to the fixing surface and is connected to the terminal of the relay; and the second end of the bus bar is projected perpendicularly from the fixing surface of the resin block and is soldered to the printed wiring pattern formed on the printed circuit board.

5. An electrical connection box, comprising:

a resin block having at least one relay mounting opening;

at least one bus bar insert-molded in the resin block and having a first end with a straight portion and a bent portion, the bent portion connected with a terminal of the relay by welding, and a second end soldered to a printed wiring pattern formed on the printed circuit board, the second end being colinear with the straight portion of the first end and projecting outwardly in the width direction of the resin block; and a case body receiving the relay mounted into the resin block together with the printed circuit board, wherein the bent portion is within the at least one relay opening and overlaps with the terminal of the relay, and wherein the resin block has a rectangular parallelepiped shape and has a fixing surface fixed onto the printed circuit board.

6. A mounting structure arranged on a printed circuit board, comprising:

a relay having first and second pin-terminals;

a resin block having at least one relay mounting opening; and a first bus bar insert-molded in the resin block and having a first end with a straight portion and a bent portion, the bent portion connected with the first pin-terminal of the relay by welding, and a second end soldered to a printed wiring pattern formed on the printed circuit board, the second end being colinear with the straight portion of the first end and projecting outwardly in the width direction of the resin block, wherein the bent portion overlaps with the first pin-terminal of the relay, and wherein the resin block has a rectangular parallelepiped shape and has a fixing surface fixed onto the printed circuit board.

7. The mounting structure according to claim 6, further comprising:

a second bus bar insert-molded in the resin block and having a first end connected with the second pin-terminal of the relay by welding, and a second end extending through a hole formed in the printed circuit board.

8. The mounting structure according to claim 6, wherein:

the at least one relay mounting opening includes a plurality of relay mounting openings formed in line on a middle in the width direction of the resin block and are inserted with a plurality of relays;

the at least one bus bar includes a plurality of bus bars extending from each of the relay mounting openings in a width direction of the resin block;

first ends of the plurality of bus bars are connected to terminals of the relays by welding; and second ends of the plurality of bus bars project outwardly in the width direction of the resin block.

9. The mounting structure according to claim 6, wherein:

the first end of the bus bar is projected away from a surface of the resin block perpendicular to the fixing surface and is connected to the terminal of the relay; and the second end of the bus bar is projected perpendicularly from the fixing surface of the resin block and is soldered to the printed wiring pattern formed on the printed circuit board.

10. An electrical connection box comprising:

a relay having first and second pin-terminals;

a resin block having at least one relay mounting opening;

a first bus bar insert-molded in the resin block and having a first end with a straight portion and a bent portion, the bent portion connected with the first pin-terminal of the relay by welding, and a second end soldered to a printed wiring pattern formed on the printed circuit board, the second end being colinear with the straight portion of the first end and projecting outwardly in the width direction of the resin block; and a case body receiving the relay mounted into the resin block together with the printed circuit board, wherein the bent portion overlaps with a respective pin-terminal of the relay, and wherein the resin block has a rectangular parallelepiped shape and has a fixing surface fixed onto the printed circuit board.

* * * * *